United States Patent
Aziz et al.

(10) Patent No.: US 7,706,487 B2
(45) Date of Patent: Apr. 27, 2010

(54) METHOD FOR TRAINING A TRANSCEIVER FOR HIGH SPEED COMMUNICATIONS

(75) Inventors: Pervez Mirza Aziz, Dallas, TX (US); Donald Raymond Laturell, Allentown, PA (US); Mohammad Shafiul Mobin, Orefield, PA (US); Gregory W. Sheets, Bangor, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 1110 days.

(21) Appl. No.: 10/964,056

(22) Filed: Oct. 12, 2004

(65) Prior Publication Data

US 2005/0078758 A1 Apr. 14, 2005

Related U.S. Application Data

(60) Provisional application No. 60/510,206, filed on Oct. 10, 2003.

(51) Int. Cl.
    *H04B 1/10* (2006.01)
(52) U.S. Cl. ................................................ 375/350
(58) Field of Classification Search ................ 375/257, 375/350, 230, 295, 316
    See application file for complete search history.

(56) References Cited

U.S. PATENT DOCUMENTS

| 7,254,171 | B2 * | 8/2007 | Hudson | 375/229 |
| 7,280,607 | B2 * | 10/2007 | McCorkle et al. | 375/295 |
| 2002/0122503 | A1 * | 9/2002 | Agazzi | 375/316 |
| 2004/0022432 | A1 * | 2/2004 | Hayata et al. | 382/159 |
| 2006/0117203 | A1 * | 6/2006 | Jonnalagadda | 713/400 |
| 2007/0147559 | A1 * | 6/2007 | Lapointe | 375/350 |

OTHER PUBLICATIONS

Stonick et al., "An Adaptive PAM-4 5-Gb/s Backplane Transceiver in 0.25-um CMOS", IEEE Journal of Solid State Circuits, vol. 38, No. 3 Mar. 2003.

* cited by examiner

*Primary Examiner*—David C Payne
*Assistant Examiner*—Leon-Viet Q Nguyen

(57) ABSTRACT

In training a SERDES, a Common Electrical Interface (CEI) training frame, having certain bits of information embedded therein, is transmitted over a path which comprises transmitter, channel, and receiver components. The present invention analyzes the resulting received signal and determines the effective aggregate channel impulse response of these three components. The invention then determines an estimate of the inverse of this aggregate channel and uses this determination to reduce distortions that have been introduced into a signal that has been transmitted over the path.

24 Claims, 5 Drawing Sheets

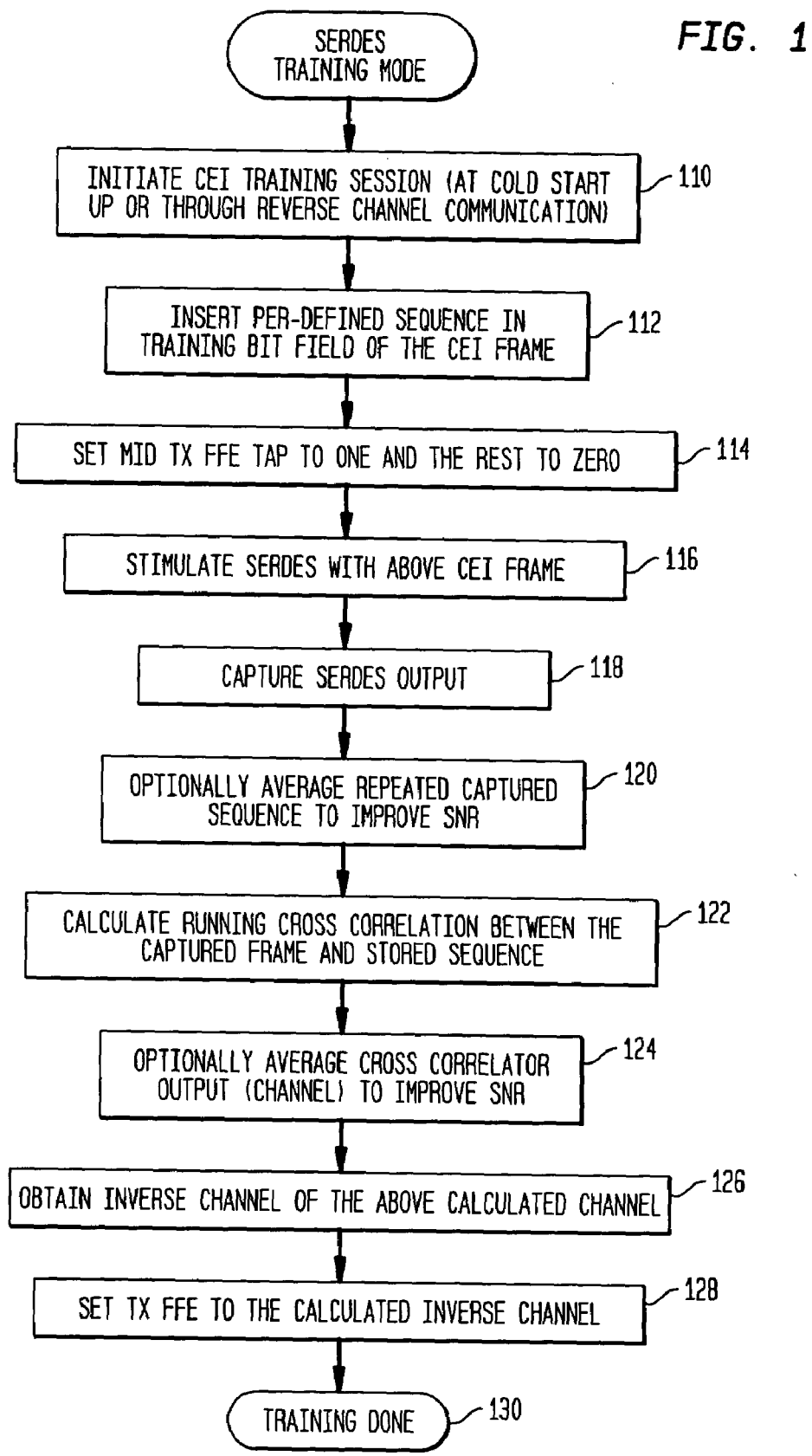

METHOD FOR TRAINING A TRANSCEIVER FOR HIGH SPEED COMMUNICATIONS

CROSS REFERENCE TO RELATED APPLICATIONS

This application claims the priority of provisional U.S. application Ser. No. 60/510,206 filed on Oct. 10, 2003 and entitled "Serdes with Automatic Channel Learning Capabilities" by Pervez Mirza Aziz; Donald Raymond Laturell; Mohammad Shafiul Mobin; Gregory W. Sheets; and, Lane A. Smith, the entire contents and substance of which are hereby incorporated in total by reference.

FIELD OF THE INVENTION

The present invention is related to high-speed communications of data in a communication system and, in particular, to a method for training a device configured for high data rate transmission of data between components in a communication system.

BACKGROUND OF THE INVENTION

Many conventional systems for transmitting data between components within a cabinet or between cabinets of components use copper or optical backplanes for transmission of digital data. For example, high data rate transceiver systems are utilized in many backplane environments, including optical switching devices, router systems, switches, chip-to-chip communications and storage area networking switches. Other environments that utilize high-speed communication between components include inter-cabinet communication and chip-to-chip communications. Typical separation of components in such systems is between about 0.1 to about 10 meters.

Existing techniques utilized in such environments typically use non-return to zero (NRZ) modulation to send and receive information over high-speed backplanes or for high data rate chip-to-chip interconnects. Typically, the transceiver for sending high-speed data over a backplane is called a serializer/deserializer, or SERDES, device. A typical SERDES device utilizes an equalizer to reduce the effects of distortions that are introduced in the transmission process. This equalizer can be situated at the transmitter side (referred to as "pre-emphasis") or it can be placed at the receiving end (referred to as "receiver equalization").

When a SERDES device is connected to the backplane, the SERDES device must be activated in order to communicate with the backplane. This is typically referred to as training the SERDES device. When training the SERDES device, information bits (i.e. training bits) are input into the SERDES and the output of the SERDES is received and analyzed for the presence of these training bits in order to determine if the SERDES is communicating properly with the backplane. This method requires that these training bits be captured reliably in order to train the equalizer. However, reliable capture of the training bits requires that the frame from which the training bits are captured by equalized. Since reliable capture requires equalization and equalization cannot occur without reliable capture, it is difficult to train the SERDES properly. Therefore, a need exists in the prior art for a method for training a SERDES that overcomes this problem.

SUMMARY OF THE INVENTION

In training a SERDES, a Common Electrical Interface (CEI) training frame, having certain bits of information embedded therein, is transmitted over a path which comprises transmitter, channel, and receiver components. The present invention analyzes the resulting received signal and determines the effective aggregate channel impulse response of these three components. The invention then determines an estimate of the inverse of this aggregate channel and uses this determination in an effort to undo distortions that have been introduced into a signal that has been transmitted over the path.

If the equalization is to be performed in the receiver, the receiver center tap is set to one and the rest of the taps to zero. On the other hand, if the equalization is to be performed in the transmitter, the transmitter center tap is set to one and the rest to zero. It is not a requirement that the center tap be set to one, but any tap can be set to one and the rest to zero in either the transmitter or the receiver as al alternative. Moreover, one may also set the taps to any arbitrary known values and compensate the setting later.

FIG. 1 is a flow chart that illustrates the method of the present invention. The SERDES has what is referred to as a training frame (designated CEI), which is a frame that contains certain training bits that are extracted for training the SERDES. The bits in the CEI frame are chosen to cooperate with the pre-defined sequence that is inserted in the training bit field of the CEI frame at step 112. In the Example depicted in FIG. 1, a Transmit Feed Forward Equalizer (TX FFE) is being determined. Accordingly, at step 114 one tap of the transmitter is set to one and the rest to zero. The SERDES is then stimulated with the determined CEI frame at step 116 and the output of the SERDES in response is captured at step 118.

The effective channel is then estimated using cross correlation techniques (step 122). FIG. 1 depicts various options used to average the captured sequence (step 120) and cross correlator outputs (step 124) which will be described below in greater detail. One may achieve the equivalent effect of cross correlation either in time domain or in the frequency domain through either mathematical or DSP methods. After the channel is estimated, an inverse of the channel is obtained (step 126). While FIG. 1 illustrates an example in which this result is used in the TX FFE, the invention is not so limited. That is, this inverse channel may be placed either in the transmitter side or the receiver side as a separate block or they may be combined with the existing transmitter or the receiver. Further embodiments of the invention divide the inverse channel function, placing part in transmitter and part in the receiver. The invention uses this inverse channel, wherever situated, to compensate for the distortion introduced into the signal by the aggregate communication channel.

These and other features of the invention will be more fully understood by references to the following drawings.

BRIEF DESCRIPTION OF THE DRAWINGS

FIG. 1 is a flow chart of a SERDES training method according to the present invention;

DETAILED DESCRIPTION

Figure 2A:
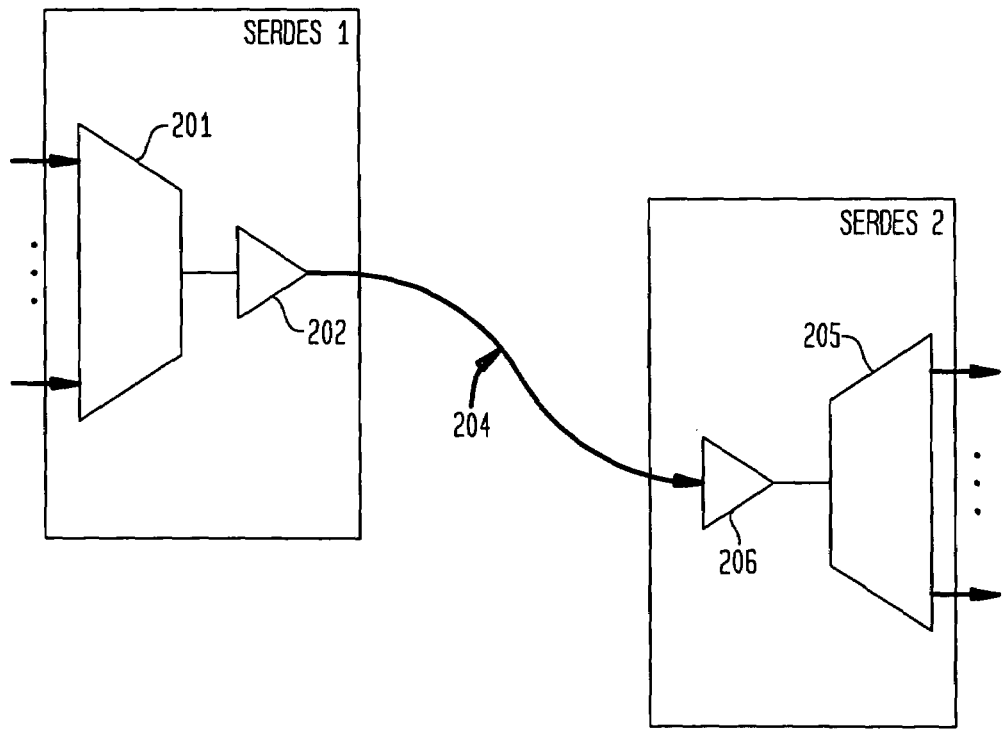
FIG. 2A is a block diagram illustrating a communication path comprising two SERDES devices.

The present invention is used to train a SERDES device. A SERDES is a common transceiver for point-to-point high-speed connections. FIG. 2A depicts a typical SERDES application in which a serializer 201 converts a low-speed parallel data bus into a high-speed, serial data stream for transmission from SERDES1 to SERDES2 through a channel 204. A deserializer 205 then converts the high-speed serial data stream back to its original parallel format. Also illustrated are filters 202, and 206 that are employed to reduce distortions that are introduced in the transmission process. FIG. 2A shows a simplex configuration because each node is shown using only half of a SERDES. Most applications require duplex configuration, for which each node uses a full SERDES and performs both serialization (transmission) and deserialization (reception).

Figure 2B:
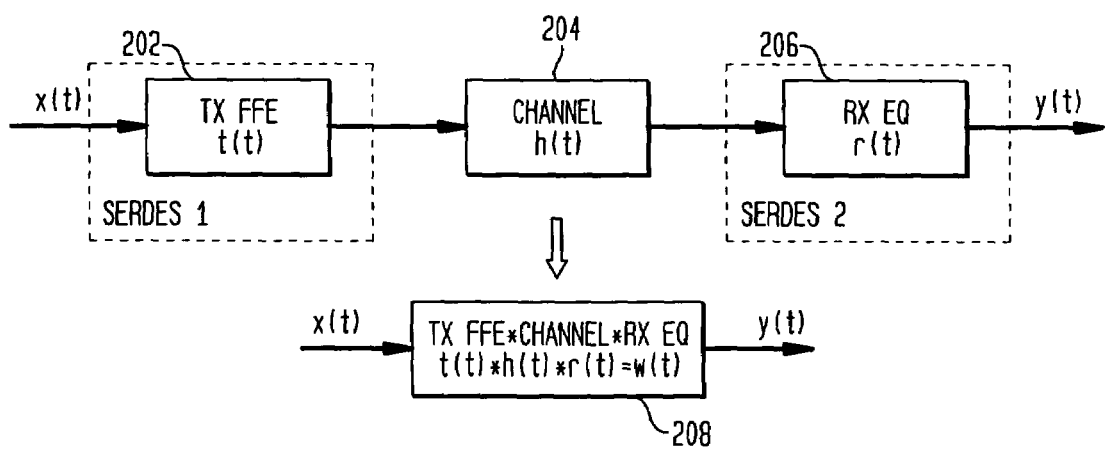
FIG. 2B is a block diagram illustrating an aggregate channel formed by a convolution of the individual transfer functions.

FIG. 2B illustrates a communication path whereby an initial signal x(t) is being transmitted from SERDES1 through the channel 204 to SERDES2 where it is received as signal y(t). FIG. 2B also identifies filters 202 and 206 as TXFFE and Receiver Equalizer (RX EQ) and indicates their transfer functions as t(t) and r(t), respectively.

The invention analyzes the received signal that results when a pre-defined sequence is inserted in the training bit field of a CEI frame and supplied to the SERDES. As is well-known in the art, the effective transfer function w(t) of the TX FFE, channel and RX EQ combination can be expressed as a convolution of their individual transfer functions (t(t), h(t) and r(t), respectively):

$$t(t)*h(t)*r(t)=w(t)$$

As is also well known in the field of digital signal processing, convolution of any function with a delta function returns the function itself:

$$f(t)=f(t)*\delta(t)$$

Further, it is well known the auto correlation function of a sequence with wide frequency content results in a delta function. That is, letting x(n) be a pseudo-random sequence with maximal energy content, its auto-correlation function will resolve into a delta function:

Given a pseudo-random sequence of length N, $$x(n)=x(n), x(n-1), x(n-2), \ldots x(n-N+1);$$

$$x(n)*x(-n)=\delta(n)$$

Using these principles, an alternative to the above aggregate channel transfer function can be determined:

Effective transfer function from above:

$$t(t)*h(t)*r(t)=w(t)$$

Setting x(t) to be a pseudo-random sequence with maximal energy, the response of the aggregate system becomes:

$$y(t)=[t(t)*h(t)*r(t)]*x(t)$$

Cross-correlating the output of the aggregate system with x(t), the aggregate channel itself can be obtained:

$$\begin{aligned} Y(t)*x(-t) &= [t(t)*h(t)*r(t)]*x(t)*x(-t) \\ &= [t(t)*h(t)*r(t)]*\delta(t) \\ &= t(t)*h(t)*r(t) \\ &= w(t) \end{aligned}$$

That is, the effective channel transfer function between the input x(t) and the output y(t) can be expressed as the cross correlation of those signals.

Once the impulse response is determined as above, the inverse of the impulse response is derived. As noted above, this inverse of the impulse response can then be used to equalize the distortion introduced into the input signal x(n) which resulted as output y(n). Optimally, the following condition needs to be determined for all frequencies:

$$F\{w(t) \times F\{w_{inv}(t)\}=1, \text{ where } F\{\} \text{ is the Fourier Transform}$$

Figure 3:
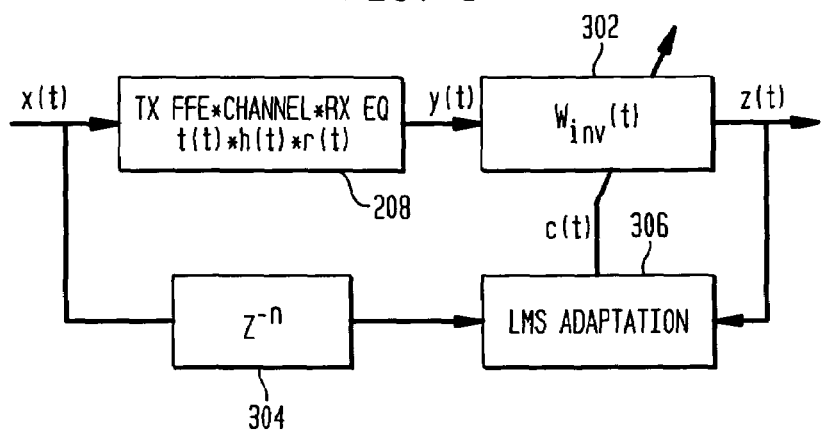
FIG. 3 is a block diagram illustrating the adaptive estimation of the inverse channel function using an embodiment of the invention.

In the above formula, the term $w_{inv}(t)$ is the equalizer coefficients that are sought. An estimate for this inverse channel can be readily determined using a well-known LMS adaptation algorithm. An example of such an adaptation scheme is illustrated in FIG. 3. In the embodiment of the invention depicted, the adaptive inverse channel estimate $w_{inv}(t)$ 302 is obtained by using a Least Mean Squares (LMS) adaptation algorithm 306. As before signal x(t) is supplied to the aggregate channel 208. It is also supplied to the LMS Adaptation module 306 after incurring a set delay 304. The output of the aggregate channel 208, signal y(t), is processed by module 302 to yield z(t). This z(t) signal is then compared in the LMS Adaptation module 306 with the appropriately delayed x(t) signal. In this manner a set of coefficients, c(t), is determined that minimizes the mean square error between these two signals. These coefficients are then supplied to module 302 to improve the $w_{inv}(t)$ estimate. In additional, alternative embodiments of the invention this process is performed iteratively until a minimum error is attained and/or little or no improvement occurs between successive iterations.

In one embodiment of the invention, the above calculations are performed in the SERDES located in the receiving side of the transmitted signal (SERDES2 as depicted in FIG. 2B). Alternative embodiments of the invention have some or all of these calculations performed in the SERDES located in the sending side (SERDES1). This flexibility of where some or all of the calculations are to be performed is enabled by well-known methods of communication between SERDES devices (via in-band or out of band communication) that are independent of channel 204.

Figure 4:
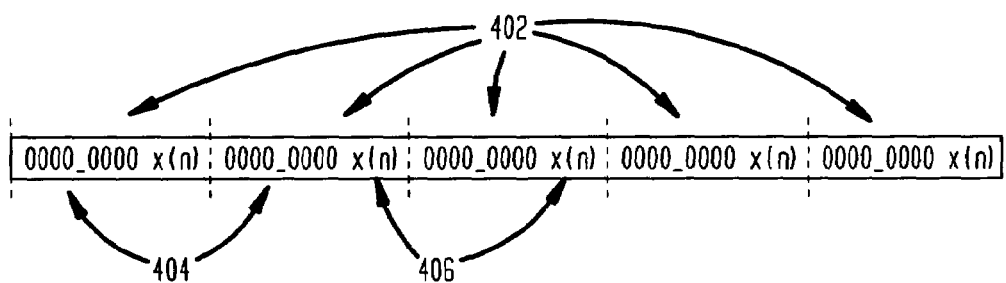
FIG. 4 illustrates an example of a CEI frame input to the SERDES.

An additional embodiment of the invention will now be described in which the design of a CEI training frame will now be discussed. FIG. 4 depicts CEI frame input 402 to the SERDES. As illustrated, each frame 402 comprises string of 0's (or 1's) 404 to essentially clear the channel memory. Each frame 402 also comprises a pseudo-random sequence x(n) of training information, 406. Not depicted in FIG. 4 are additional information fields that may be present in each frame 402, such as header, trailer and additional data fields. In a further embodiment the x(n) sequence is designed for dc balancing of the effects of a string of 0's (or 1's). That is, the string will be randomized and not contain all 0's (or 1's). Further, the x(n) sequence will be known by the TX and RX, apriori. In still further embodiments the x(n) string will be of 16 bits in length, or alternatively 24 bits in length.

Figure 5:
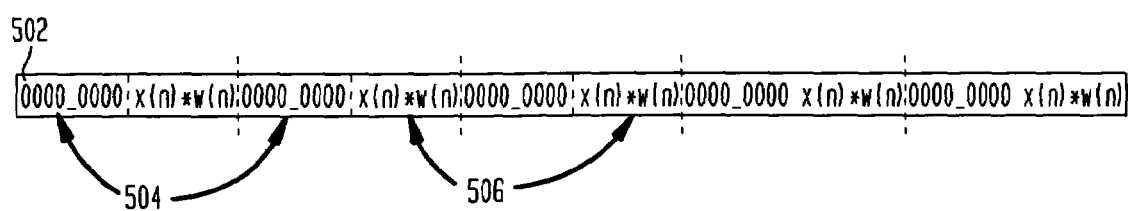
FIG. 5 illustrates the CEI frame output from the SERDES that corresponds to the input of FIG. 4.

FIG. 5 illustrates the output sequence 502 of the RX EQ 206 once the CEI frame inputs 402 have been processed. In particular, the output sequence consists of repeated sets of a string of 0's (or 1's), 504 followed by x(n)*w(n), 506. As described above, this output is processed by the invention to obtain the estimated aggregate channel response. Additional embodiments of the invention perform this function using alternative methods for averaging out the sampling jitter from the estimated aggregate channel response.

Figure 6:
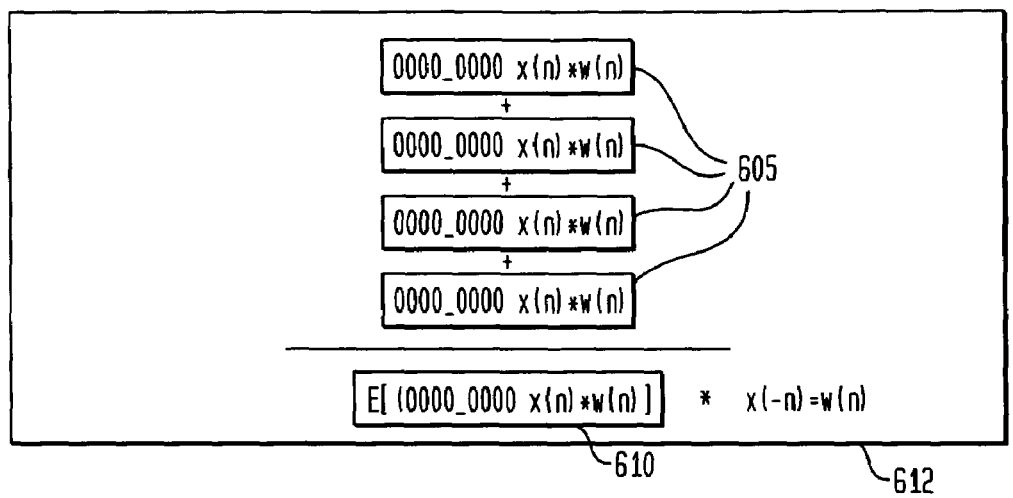
FIG. 6 illustrates the method according to one embodiment of the invention by which the channel estimation is derived using an average of the output signals.

FIG. 6 illustrates one alternative embodiment of the invention in which ensemble averaging of the RXEQ outputs 605 is first performed to yield an averaged signal E[0000_0000 x(n)*w(n)], item 610. A cross correlation is then performed on the average signal to obtain the estimated aggregate channel response w(n), item 612.

Figure 7:
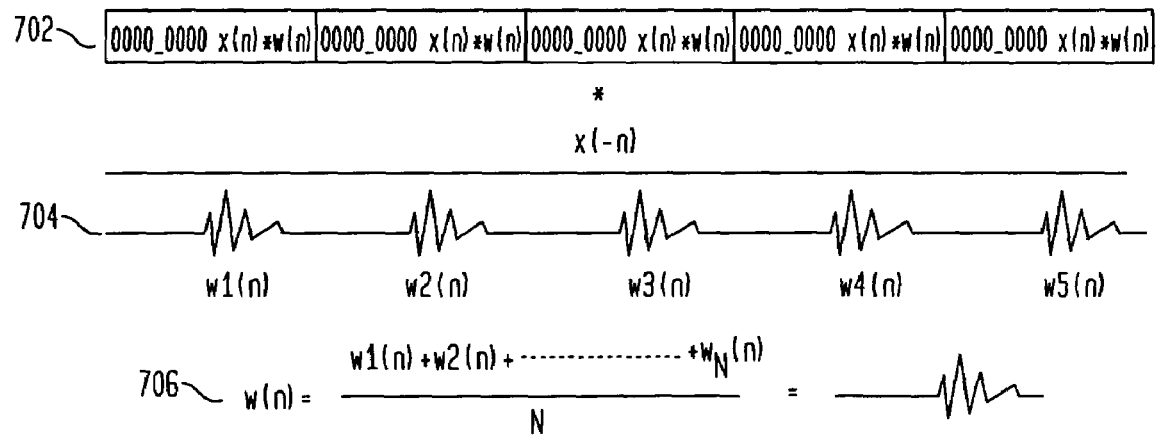
FIG. 7 illustrates an alternative embodiment of the invention wherein individual channel estimates are averaged to obtain a final channel estimation; and, FIG. 8 illustrates the overall process of the invention.

FIG. 7 illustrates a second alternative embodiment in which the individual channels are estimated from each block of the pseudo-random sequence. That is, a calculation is performed at step 704 of the running cross correlation between the captured CEI frame (sub-sampled) and the stored reference pseudo-random signal x(n) item 702. These results are then averaged at step 706 to yield the estimated aggregate channel response, w(n). Once the estimated aggregate channel response is determined, the invention calculates an inverse channel estimate as described above.

Figure 8:
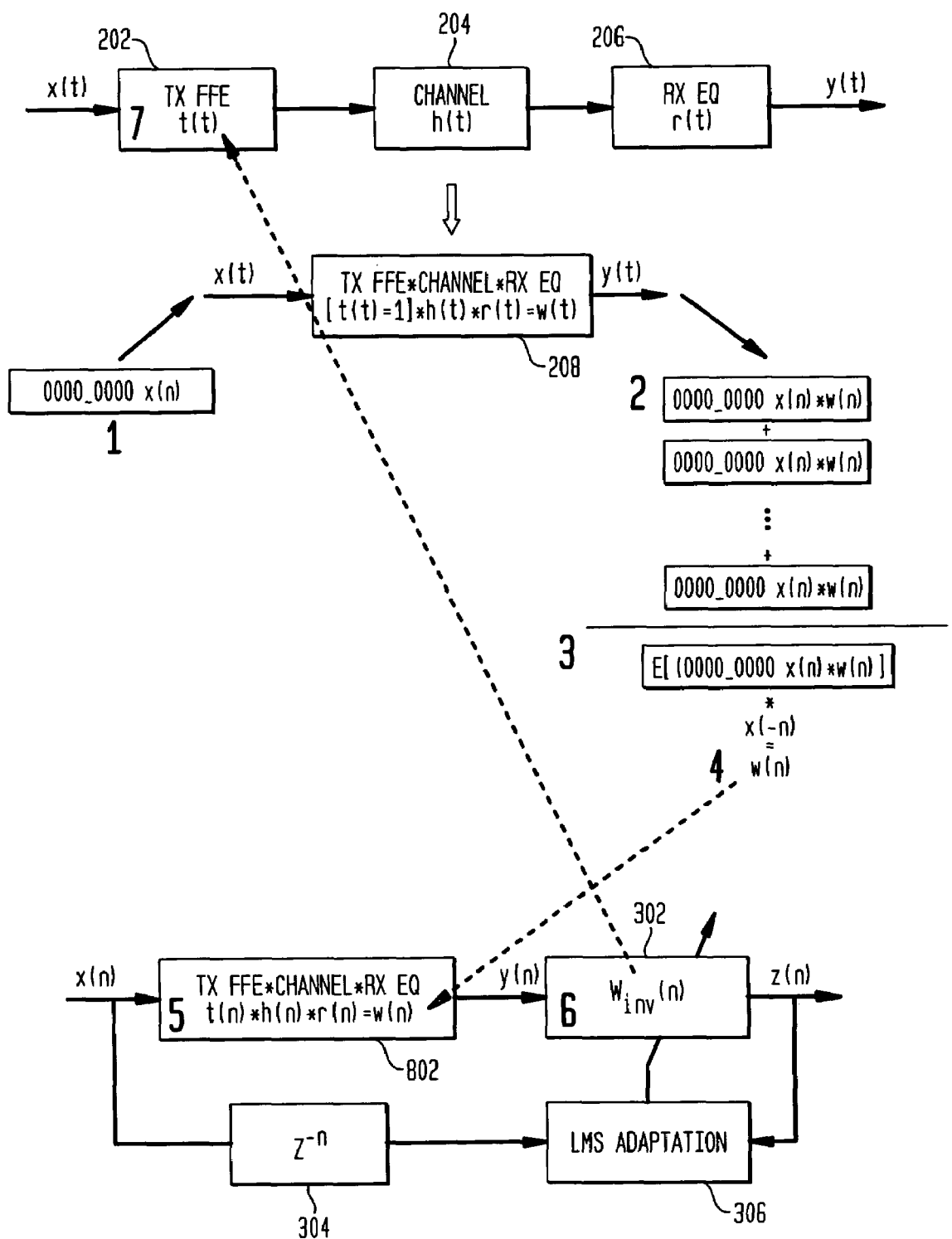

FIG. 8 illustrates a summary of the overall process. That is, FIG. 8 illustrates an embodiment of the invention which denotes the following numbered steps:

1. A pre-defined input sequence, x(t), is supplied to the aggregate path 208
2. A corresponding output sequence, y(t), is determined
3. An average is obtained for a series of outputs
4. A cross correlation is performed between the input sequence and the average output to yield an aggregate channel impulse response
5 & 6. The resulting aggregate channel impulse response 802 is then used in a LMS adaptation algorithm to estimate an inverse of the aggregate channel impulse response
7. The inverse obtained is introduced in the aggregate path.

In the embodiment of the invention depicted in FIG. 8, once an estimate is obtained for $w_{inv}(n)$, this inverse filter is introduced in the transmitter component 202 to thereby undo distortions that will occur in future signal transmissions over the transmitter, channel and receiver aggregate path. In alternative embodiments this inverse filtering process could occur solely in the receiver component 206 or could be divided in various ways between the TX FFE 202 and RX EQ 206 components of SERDES1 and SERDES2, respectively. Effecting this inverse filtering can be readily accomplished over a device controller (e.g. microprocessor or hardware) that controls communication (either in-band or out of band communication) between SERDES devices, as is well-known in the art.

It should be noted that in addition to training occurring upon activation, SERDES training can be scheduled to occur periodically to take into account changing conditions (e.g. temperature) that may effect the aggregate channel response.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An apparatus containing a serial/deserializer transceiver device (SERDES) for transmitting communications over an aggregate path to a receiving SERDES device; said aggregate path having an input and an output and comprising the transmitting SERDES, a channel and the receiving SERDES, said channel introducing distortions into said signal; said apparatus comprising
    a training frame for supplying a pre-defined input sequence to the input of the aggregate path, wherein said input sequence comprises multiple training frames wherein each frame comprises a string of like bits and a pseudo-random sequence; and,
    a processor for
    determining an output of the aggregate path that corresponds to the pre-defined input sequence,
    performing a cross-correlating analysis between the pre-defined input sequence and the corresponding output to determine an aggregate channel impulse response of the aggregate path using an average of a plurality of outputs;
    estimating an inverse of the aggregate channel impulse response; and
    utilizing said inverse in at least one of said SERDES devices to reduce said distortions.

2. The apparatus of claim 1, wherein the receiving SERDES is located in the apparatus.

3. The apparatus of claim 1, wherein a Transmit Feed Forward Equalizer (TX FEE) component of said transmitting SERDES utilizes at least part of said inverse to reduce said distortions.

4. The apparatus of claim 1, wherein a Receiver Equalizer (RX EQ) component of said receiving SERDES utilizes at least part of said inverse to reduce said distortions.

5. The apparatus of claim 1, wherein said processor step of performing a cross-correlation analysis further comprises:
    repeatedly performing said cross-correlating analysis for a plurality of outputs to yield a series of cross-correlation results; and,
    averaging the cross-correlation results to determine the aggregate channel response of the aggregate path.

6. The apparatus of claim 1, wherein said training occurs upon activation of the device.

7. The apparatus of claim 1, wherein said training is periodically initiated.

8. A method for training a device configured for high data rate transmission of a signal along an aggregate path, said aggregate path having an input and an output and comprising a transmitter, a channel and a receiver component, said transmission introducing distortions into said signal, said method comprising:
    supplying a pre-defined input sequence to the input of the aggregate path;
    determining an output of the aggregate path that corresponds to the pre-defined input sequence;
    performing a cross-correlating analysis between the pre-defined input sequence and the corresponding output to determine an aggregate channel impulse response of the aggregate path;
    estimating an inverse of the aggregate channel impulse response; and
    introducing said inverse into the aggregate path to reduce said distortions, wherein the device to be trained comprises a transmitting SERDES device and a receiving SERDES device and said supplying step comprises inserting the pre-defined input sequence into a training bit field of a Common Electrical Interface (CEI) frame.

9. The method of claim 8, wherein said introducing step comprises locating at least part of said inverse in said transmitter component.

10. The method of claim 8, wherein said introducing step comprises locating at least part of said inverse in said receiver component.

11. The method of claim 8, wherein said estimating step comprises the step of utilizing a least mean squares adaptation algorithm.

12. The method of claim 8, wherein said input sequence comprises multiple training frames wherein each frame comprises a string of like bits and a pseudo-random sequence.

13. The method of claim 12, wherein said performing step further comprises averaging a plurality of outputs and using said average in said cross-correlation analysis.

14. The method of claim 12, further comprising:
repeatedly performing said cross-correlating analysis for a plurality of outputs to yield a series of cross-correlation results; and,
averaging the cross-correlation results to determine the aggregate channel response of the aggregate path.

15. The method of claim 8, wherein said training occurs upon activation of the device.

16. The method of claim 8, wherein said training is periodically initiated.

17. A system for training a device configured for high data rate transmission of a signal along an aggregate path, said aggregate path having an input and an output and comprising a transmitter, a channel and a receiver component, said transmission introducing distortions into said signal, said system comprising:
a means for supplying a pre-defined input sequence to the input of the aggregate path;
a means for determining an output of the aggregate path that corresponds to the pre-defined input sequence;
a means for performing a cross-correlating analysis between the pre-defined input sequence and the corresponding output to determine an aggregate channel impulse response of the aggregate path;
a means for estimating an inverse of the aggregate channel impulse response; and
a means for introducing said inverse into the aggregate path to reduce said distortions, wherein the device to be trained is a SERDES device and said means for supplying comprises a means for inserting the pre-defined input sequence into a training bit field of a Common Electrical Interface (CEI) frame.

18. The system of claim 17, wherein said means for introducing comprises a means for locating at least part of said inverse in said transmitter component.

19. The system of claim 17, wherein said means for introducing comprises a means for locating at least part of said inverse in said receiver component.

20. The system of claim 17, wherein said input sequence comprises multiple training frames wherein each frame comprises a string of like bits and a pseudo-random sequence.

21. The system of claim 20, wherein said means for performing further comprises averaging a plurality of outputs and using said average in said cross-correlation analysis.

22. The system of claim 20, wherein said means for performing further comprises:
repeatedly performing said cross-correlating analysis for a plurality of outputs to yield a series of cross-correlation results;
and, averaging the cross-correlation results to determine the aggregate channel response of the aggregate path.

23. The system of claim 17, wherein said training occurs upon activation of the device.

24. The system of claim 17, wherein said training is periodically initiated.

* * * * *

UNITED STATES PATENT AND TRADEMARK OFFICE
CERTIFICATE OF CORRECTION

| | | |
|---|---|---|
| PATENT NO. | : 7,706,487 B2 | Page 1 of 1 |
| APPLICATION NO. | : 10/964056 | |
| DATED | : April 27, 2010 | |
| INVENTOR(S) | : Pervez Mirza Aziz | |

It is certified that error appears in the above-identified patent and that said Letters Patent is hereby corrected as shown below:

In column 4, line 5, "Y" should be replaced by -- y --.

Signed and Sealed this
Twenty-fifth Day of December, 2012

David J. Kappos
*Director of the United States Patent and Trademark Office*